United States Patent
Jeffries et al.

(10) Patent No.: US 8,253,466 B2
(45) Date of Patent: Aug. 28, 2012

(54) CLOCK GENERATORS FOR GENERATION OF IN-PHASE AND QUADRATURE CLOCK SIGNALS

(75) Inventors: Brad Porcher Jeffries, Browns Summit, NC (US); Bryan Scott Puckett, Stokesdale, NC (US)

(73) Assignee: Analog Devices, Inc., Norwood, MA (US)

( * ) Notice: Subject to any disclaimer, the term of this patent is extended or adjusted under 35 U.S.C. 154(b) by 457 days.

(21) Appl. No.: 12/505,163

(22) Filed: Jul. 17, 2009

(65) Prior Publication Data

US 2009/0273494 A1 Nov. 5, 2009

Related U.S. Application Data

(62) Division of application No. 12/002,430, filed on Dec. 14, 2007, now Pat. No. 7,576,584.

(51) Int. Cl.
*H03H 11/16* (2006.01)
(52) U.S. Cl. ........................................ 327/238; 327/254
(58) Field of Classification Search .................. 327/238, 327/254, 255
See application file for complete search history.

(56) References Cited

U.S. PATENT DOCUMENTS

| | | | |
|---|---|---|---|
| 4,994,695 A | 2/1991 | Bazes | 307/602 |
| 5,399,995 A | 3/1995 | Kardontchik et al. | 331/17 |
| 5,808,498 A | 9/1998 | Donnelly et al. | 327/255 |
| 6,362,680 B1 * | 3/2002 | Barnes | 327/407 |
| 6,441,667 B1 | 8/2002 | Boerstler et al. | 327/295 |
| 6,917,232 B2 | 7/2005 | Wyatt et al. | 327/238 |
| 6,963,236 B2 | 11/2005 | Berkram et al. | 327/238 |
| 6,970,020 B1 | 11/2005 | Mei et al. | 327/3 |
| 7,081,783 B2 | 7/2006 | Berkram et al. | 327/238 |
| 7,576,584 B2 * | 8/2009 | Jeffries et al. | 327/238 |
| 7,616,042 B2 * | 11/2009 | Suzuki | 327/291 |
| 7,864,084 B2 * | 1/2011 | Padaparambil | 341/101 |
| 2005/0127973 A1 | 6/2005 | Wyatt et al. | |
| 2006/0140325 A1 | 6/2006 | Naujokat | |
| 2007/0139127 A1 | 6/2007 | Redman-White | |

FOREIGN PATENT DOCUMENTS

EP 0896424 A1 10/1999

* cited by examiner

*Primary Examiner* — Hai L Nguyen
(74) *Attorney, Agent, or Firm* — Koppel, Patrick, Heybl & Philpott

(57) ABSTRACT

Clock generator embodiments are provided to generate half-rate I and Q clock signals. The generators are configured to insure fan-out limitations, to insure correct phasing at startup, to reduce the number of signal inverters in a critical path, and to reduce the total number of inverter structures to thereby substantially extend generator operational frequency. An exemplary generator embodiment requires only two tri-state inverters and four inverters. These clock generators are particularly suited for variety of electronic systems such as high speed data serializers.

8 Claims, 3 Drawing Sheets

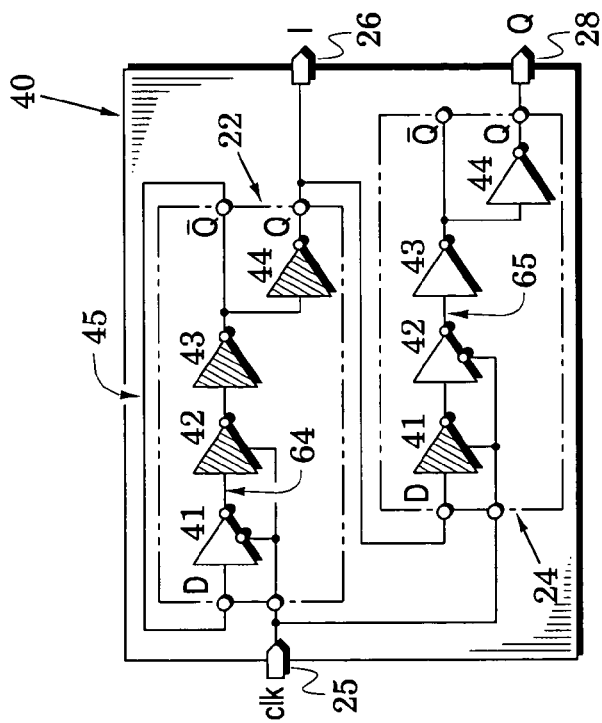
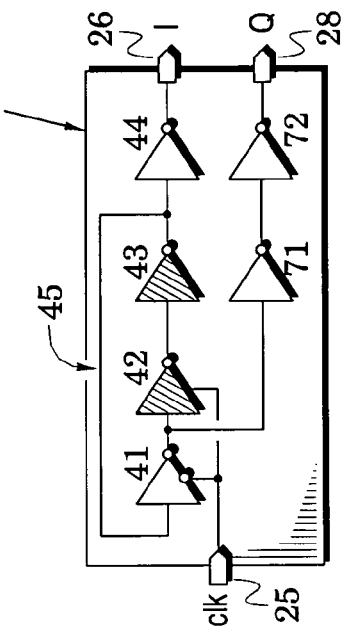
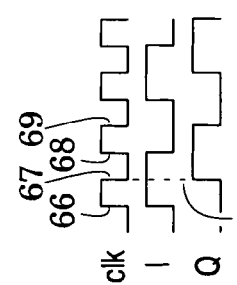
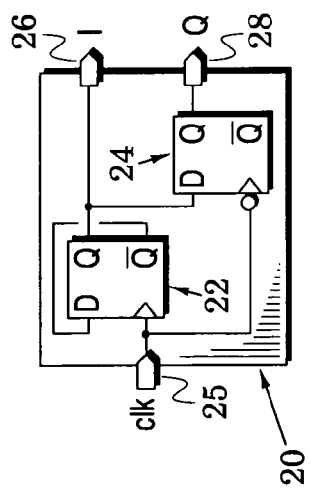

CLOCK GENERATORS FOR GENERATION OF IN-PHASE AND QUADRATURE CLOCK SIGNALS

CROSS REFERENCES TO RELATED APPLICATIONS

This application is a divisional of application Ser. No. 12/002,430 filed Dec. 14, 2007 now U.S. Pat. No. 7,576,584, and claims priority of that application.

BACKGROUND OF THE INVENTION

1. Field of the Invention

The present invention relates generally to clock generators.

2. Description of the Related Art

A quadrature clock signal is one that is delay by one-quarter of a clock phase from another clock signal which is generally termed the in-phase clock. Such clocks are often referred to by the abbreviations of I and Q clocks. Clock generators that can provide I and Q clocks are of value in a number of modern electronic systems. For example, I and Q clocks find use in data recovery systems, I/Q signal modulators and demodulators, signal multiplexers, data recovery systems, and phase lock loop systems. Because of this wide application, it is desirable to have clock generators whose structure extends the range of operational speeds and insures correct phase relationship between the I and Q clock signals over all operational conditions (e.g., at startup).

BRIEF SUMMARY OF THE INVENTION

The present invention is generally directed to clock generators. The drawings and the following description provide an enabling disclosure and the appended claims particularly point out and distinctly claim disclosed subject matter and equivalents thereof.

BRIEF DESCRIPTION OF THE DRAWINGS

FIG. 1 is a block diagram of an I/Q clock generator embodiment that is formed with D flip-flops;

FIG. 2 is a timing diagram that illustrates signals in and out of the I/Q clock generator of FIG. 1;

FIG. 3 is another I/Q clock generator embodiment that uses inverter realizations of the flip-flops of FIG. 1;

FIG. 4 is another I/Q clock generator embodiment that eliminates elements of FIG. 3;

DETAILED DESCRIPTION OF THE INVENTION

Figure 5:
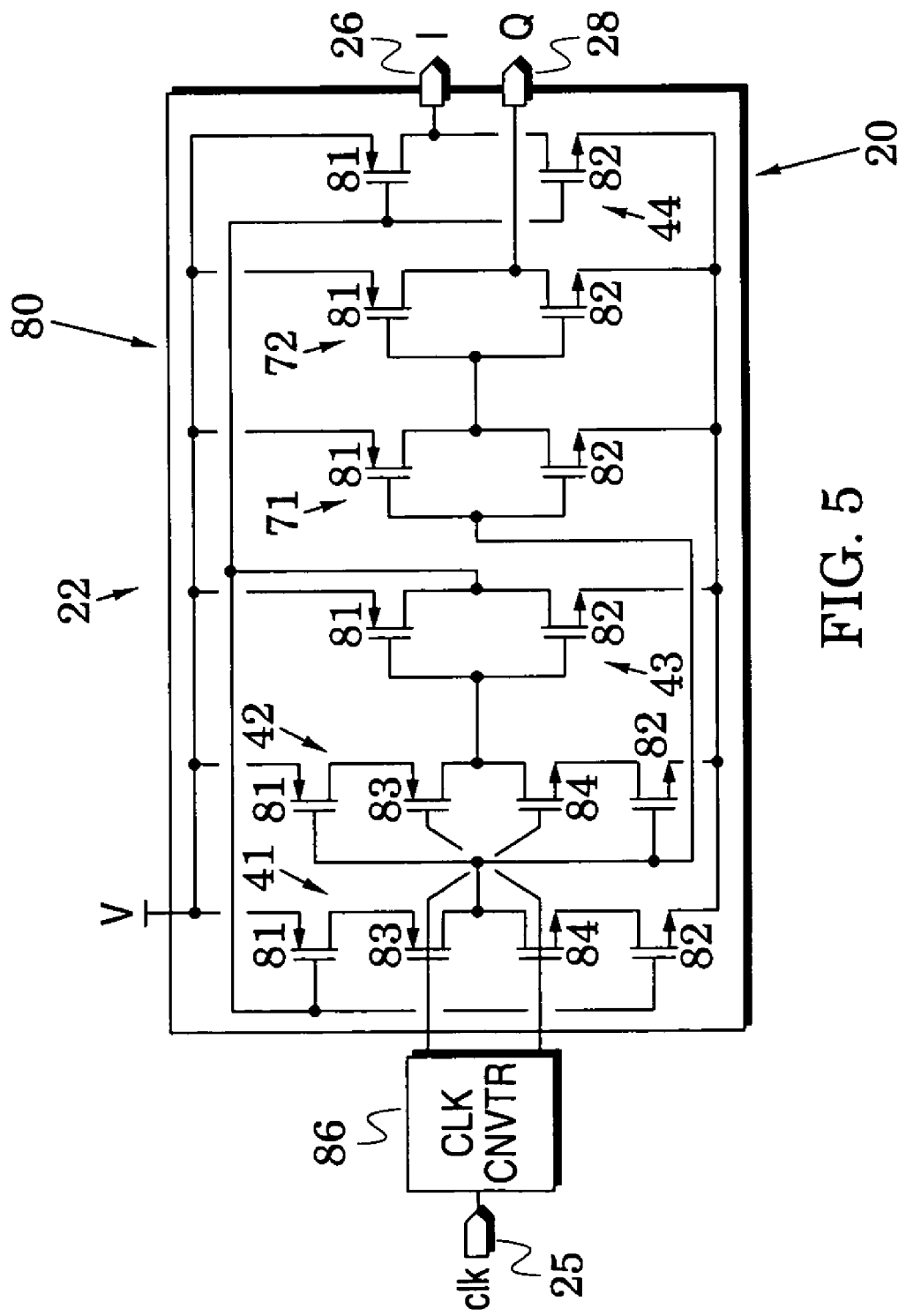
FIG. 5 is another I/Q clock generator embodiment that realizes inverters of FIG. 4 with metal-oxide-semiconductor transistors.

FIGS. 1-5 illustrate clock generator embodiments which generate half-rate in-phase and quadrature clock signals in response to an input clock signal. FIG. 6 then illustrates a data serializer that is formed with any one of the clock generator embodiments. In all of the clock generator embodiments, the quadrature clock lags the in-phase clock by ninety degrees and both run at half the rate of the input clock signal.

The generator embodiments are configured for high-speed operation (e.g., exceeding 2 GHz) and are configured so that the in-phase and quadrature clocks are delivered with the correct phase relationship each time that a generator is enabled. Accordingly, these embodiments provide reliable high-speed clock generators which can be used in variety of electronic systems such as data serializers which are capable of higher rates than conventional data serializers. A data serializer embodiment 100 is shown in FIG. 6.

In particular, FIG. 1 illustrates a clock generator embodiment 20 which includes first and second edge-triggered D flip-flops 22 and 24. Each D flip-flop has a clock port, a D input port, and Q and Q-bar output ports. D flip-flops are especially suited for recovery of data from high-speed data streams because the state of their Q output port takes on the state of a data stream at the D input port at the moment that a clock signal at the clock input port changes states (i.e., at a clock edge such as an edge in which the clock transitions from a low state to a high state).

In FIG. 1, the Q-bar output port of the first D flip-flop 22 is coupled back to this flip-flop's D input port and the Q output port of the first flip-flop is coupled to the D input port of the second flip-flop 24. The generator's clock input port 25 is coupled to the clock input ports of each of the D flip-flops and the Q output ports of the first and second flip-flops are respectively coupled to generator output ports 26 and 28. It is particularly noted that the second D flip-flop 24 is configured to respond to each clock edge in a manner opposite to that of the first D flip-flop 22 (note the open circle at the clock input port of the flip-flop 24 which indicates inversion).

Operation of the clock generator 20 can be examined with the aid of FIG. 2 which illustrates a clock signal clk that is applied to the clock port 25. Because the Q output port of the first D flip-flop 22 takes on the signal state at this flip-flop's D input port at the rising edges of the clock signal and because the signal at the Q-bar output port is always applied to the D input port, the signal at the Q output port is a half-rate clock with its rising edges coincident with the rising edges of the clock signal clk. This generates the half-rate, in-phase signal I which is provided at the generator's output port 26. That is, the feedback between the Q-bar output port and the D input port of the flip-flop 22 provides a divide-by-two operation that generates the half-rate in-phase signal I at the I output port 26.

Because the clock ports of the first and second D flip-flops 22 and 24 are configured to respond to opposite edges of the clock signal, the Q output port of the second D flip-flop takes on the state of the in-phase signal I at each falling edge of the clock signal clk (an exemplary clock falling edge is indicated by the broken line 29). Accordingly, the signal at the Q output port is the half-rate, quadrature signal Q which is provided at the generator's output port 28. It is important to note that the quadrature signal Q is forced to always lag the in-phase signal I by one-fourth of the period of the in-phase signal. This result is insured because the in-phase signal I is presented to the D input port of the second D flip-flop and this flip-flop responds at the falling edges of the clock signal clk.

FIG. 3 illustrates a clock generator embodiment 40 in which the first and second D flip-flops 22 and 24 of FIG. 1 are each realized with two tri-state inverters 41 and 42 and with an inverter 43 that are all serially-connected between the flip-flop's D input port and Q-bar output port. Each of the first and second D flip-flops are also realized with another inverter 44 that is coupled between the inverter 42 and the flip-flop's Q output port. A feedback path 45 then connects the Q-bar output port and the D input port of the flip-flop 22.

The tri-state inverters 41 and 42 are configured to respond to a clock signal clk by inverting input signals during one half-cycle of the clock signal and hold output signals during a second half-cycle (i.e., the inverting process provides two operational states and the hold process provides a third operational state). They are also configured to act on opposite clock edges in the flip-flops 22 and 24 (note that tri-state inverter 41 is shown with an inverting circle in the D flip-flop 22 whereas tri-state inverter 42 is shown with an inverting circle in the D flip-flop 24).

In the flip-flop 22, the tri-state inverter 42 and the inverter 43 are shaded to indicate that they form a critical path wherein a critical path is the portion of a circuit that limits operational speed. Improving the speed of a critical path of a system will enhance the system's operational speed whereas this does not occur for system elements that are not part of the critical path.

In the flip-flop 22, the tri-state inverter 42 transitions into its inversion mode at each rising edge of the clock signal clk (at these edges, the tri-state inverter 41 transitions into its hold mode). Change of the signal state at the D input port will therefore be delayed from each rising clock edge by the propagation delays of the tri-state inverter 42 and the inverter 43. If delays through these two devices reach one-half of the period of the clock signal clk, the generator's operation is endangered because the feedback signal through the feedback path 45 will not arrive in time for proper processing.

The output inverter 44 of the first flip-flop 22 and the first tri-state inverter 41 of the second flip-flop 24 are also shaded to indicate a critical path. If delays through these elements plus delays through the tri-state inverter 42 and inverter 43 of the first flip-flop 22 reach one-half of the period of the clock signal clk, the first tri-state inverter 41 of the second flip-flop 24 will not be properly triggered. As long as the shaded elements of the generator 40 are fast enough to satisfy these two concerns and the non-shaded elements are comparably configured, the generator 40 will operate properly.

The clock generator 60 of FIG. 4 is obtained with the realization that some of the functions of the first and second flip-flops 22 and 24 of FIG. 3 can be combined which facilitates substantial circuit simplification. In particular, the tri-state inverters 41 and 42, the inverters 43 and 44, and the associated feedback path 45 of the flip-flop 22 of FIG. 3 are duplicated in the clock generator 60 so that it also functions as a divide-by-two circuit and provides the in-phase signal I at the output port 26. The quadrature signal Q in the clock generator 60 is then obtained with the realization that the signals at circuit paths 64 and 65 in FIG. 3 are equivalent.

This realization may be examined by initially assuming that the signal in the feedback path 45 of FIG. 3 is in a high state. At the rising clock edge 66 in FIG. 2, the tri-state inverter 41 in the first flip-flop 22 enters its hold mode and the associated tri-state inverter 42 enters its inverting mode. Accordingly, the signal in the circuit path 64 is held in a low state, the signal in the feedback path 45 snaps to a low state, and the in-phase signal I at the output port 26 snaps from a low state to a high state. Prior to the rising clock edge 66, the tri-state inverter 41 in the second flip-flop 24 was in its hold mode and the associated tri-state inverter 42 was in its inverting mode so that its output was in a low state and the quadrature signal Q at the output port 28 was in a low state. At the rising clock edge 66, the tri-state inverter 41 in the second flip-flop 24 enters its inverting mode and the associated tri-state inverter 42 enters its hold mode so that the circuit path 65 and the quadrature signal Q at the output port 28 remain held in their low states.

At the falling clock edge 67 in FIG. 2, the tri-state inverter 41 in the first flip-flop 22 enters its inverting mode and the associated tri-state inverter 42 enters its hold mode. The signal in the circuit path 64 snaps to a high state but the signal at the output of the tri-state inverter 42 is held in its prior high state so that the signal in the feedback path 45 remains in its low state and the in-phase signal I at the output port 26 remains in its high state. At the falling clock edge 67, the tri-state inverter 41 in the second flip-flop 24 enters its hold mode so that its output signal remains low. At the same edge, the associated tri-state inverter 42 enters its inverting mode so that the signal in the circuit path 65 snaps into a high state. Accordingly, the quadrature signal Q at the output port 28 also snaps into the high state as indicated in FIG. 2.

At the rising clock edge 68 in FIG. 2, the tri-state inverter 41 in the first flip-flop 22 again enters its hold mode and the associated tri-state inverter 42 again enters its inverting mode. Accordingly, the signal in the circuit path 64 remains in a high state, the signal in the feedback path 45 snaps to a high state, and the in-phase signal I at the output port 26 snaps to a low state as indicated in FIG. 2. At the rising clock edge 68, the tri-state inverter 41 in the second flip-flop 24 again enters its inverting mode and the associated tri-state inverter 42 again enters its hold mode. Accordingly, the signal in the circuit path 65 and the quadrature signal Q remain in the high state as indicated in FIG. 2 but the output of the tri-state inverter 41 remains in a low state.

At the falling clock edge 69 in FIG. 2, the tri-state inverter 41 in the first flip-flop 22 again enters its inverting mode and the associated tri-state inverter 42 again enters its hold mode. The signal in the circuit path 64 snaps to a low state, the signal at the output of the tri-state inverter 42 remains in its low state so that the signal in the feedback path 45 remains in its high state and the in-phase signal I at the output port 26 remains in its low state. At the falling clock edge 67, the tri-state inverter 41 in the second flip-flop 24 enters its hold mode and the associated tri-state inverter 42 enters its inverting mode. The output of the tri-state inverter 41 goes into a high state, the signal path 65 snaps to a low state and the quadrature signal Q at the output port 28 also snaps into a low state as indicated in FIG. 2.

Investigation of the operational description of the preceding four paragraphs finds that the signals at the circuit paths 64 and 65 are held in low states at the rising clock edge 66, snap to a high state at the falling clock edge 67, remain in a high state at the rising clock edge 68, and snap to a low state at the falling clock edge 69. The signals at circuit paths 64 and 65 in FIG. 3 are thus equivalent signals because they respond identically at all of the clock edges.

With this realization, it is seen that the inverters 43 and 44 of the second flip-flop 24 in FIG. 3 can provide the quadrature signal Q at the output port 28 by processing the signal of the circuit path 64 rather than processing the signal of the circuit path 65 and this altered processing will eliminate the need for the tri-state inverters 41 and 42. The clock generator 60 of FIG. 4 is thus completed by providing serially-coupled inverters 71 and 72 that process the output of the tri-state inverter 41 to thereby provide the quadrature signal Q at the output port 28. It is apparent that only the tri-state inverter 42 and the inverter 43 now form a critical path which provides the feedback signal to the tri-state inverter 41 along the feedback path 45. This follows because as long as these devices are sufficiently fast to provide the feedback signal in less than one half of a clock period, the in-phase and quadrature signals I and Q will be reliably generated as shown in FIG. 2.

It is noted that the inverters 44 and 72 of FIG. 4 essentially act as buffers which insure that fan-out limitations of inverters 43 and 71 are not exceeded. It is further noted that a critical path of the clock generator 40 of FIG. 3 runs through four inverters whereas a critical path of the clock generator 60 is limited to only two inverters. In addition, the number of tri-state inverters is reduced from four to two. These structural clock simplifications substantially extend the operational frequency of generators. For example, operational simulations have indicated that the clock generator 60 can operate at input clock speeds that exceed 2 GHz. In an important clock feature, the drive connection between the tri-state inverter 41 and the inverter 71 insures that the quadrature clock signal Q at the output port 28 will always lag the in-phase clock signal I at the output port 26 and that this relationship will be true at clock startup.

Figure 6:
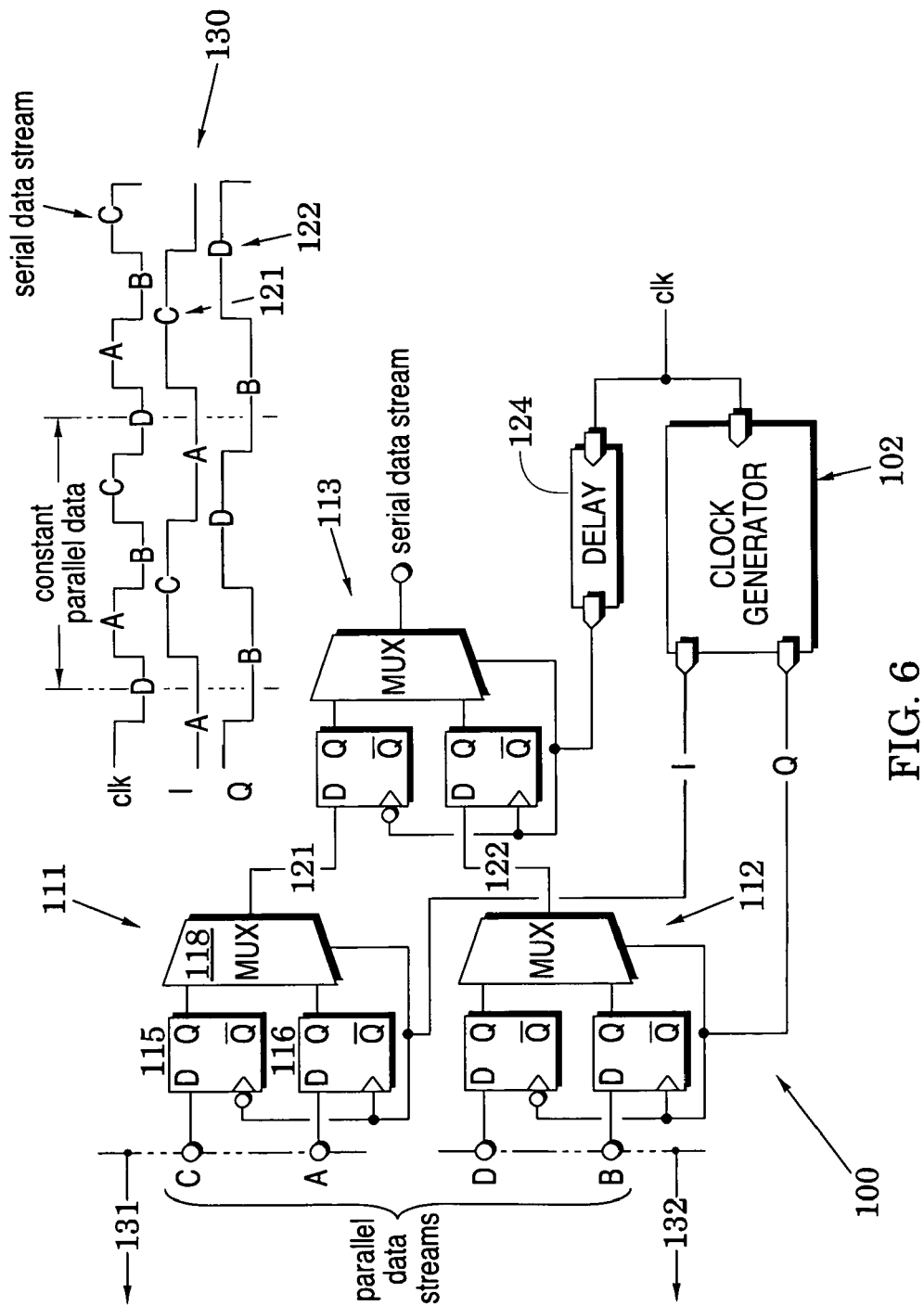
FIG. 6 is a block diagram of a data serializer that includes an I/Q clock generator embodiment.

FIG. 5 illustrates another clock generator 80 which is similar to the generator 60 of FIG. 4 with like elements indicted by like reference numbers. In the generator 80, the inverters 43, 44, 71 and 72 are each realized with transistors 81 and 82 that are arranged to form a complementary common-source stage. The coupled gates of each stage form an inverter input port and the coupled drains form an inverter output port that can push and pull load currents. Thereby, the signal state at the coupled drains is always inverted from the signal state at the coupled gates.

The tri-state inverters 41 and 42 of the generator 80 are also formed with transistors 81 and 82 that are arranged to form a first complementary common-source stage. In each of these tri-state inverters, however, additional transistors 83 and 84 are arranged as a second complementary common-source stage that is inserted between the drains of the first complementary common-source stage.

In addition, a clock converter 86 is provided to convert the single-ended clock signal clk (previously shown in FIG. 4) to a differential clock signal that drives the gates of the second complementary common-source stage in each of the tri-state inverters 41 and 42. It is noted that the drive of gates in the tri-state inverter 42 is inverted from the drive of gates in the tri-state inverter 41. This inversion causes the tri-state inverters 41 and 42 to respond oppositely to the edges of the clock signal clk of FIG. 2. That is, this inversion corresponds to the inverting circle shown in the tri-state inverter 41 in FIG. 4.

The clock generator 80 operates similarly to the clock generator 60 of FIG. 4 wherein the clock signal clk at the input port 25 is converted to a differential clock coupled to drive transistors 83 and 84 in the tri-state inverter 41 and coupled to inversely drive transistors 83 and 84 in the tri-state inverter 42.

The described clock generator embodiments are well suited for use in a variety of electronic systems. For example, FIG. 6 illustrates a data serializer 100 that converts parallel digital data streams to a serial data stream. The serializer 100 includes a clock generator 102 that may be configured in accordance with any selected one of the clock generator embodiments 20, 40, 60 and 80 of FIGS. 1-5 so that it provides half-rate in-phase (I) and quadrature (Q) clock signals in response to an input clock signal clk.

The serializer 100 also includes first, second and third serializers 111, 112 and 113. As exemplified by the first serializer 111, they are each formed with first and second D flip-flops 115 and 116 and a multiplexer 118 that is arranged to multiplex signals from the first and second flip-flops. In each serializer, the flip-flops and the multiplexer receive the same clock signal but the first flip-flop 115 is configured to respond inversely to the clock signal.

The first and second serializers 111 and 112 respectively operate in response to the in-phase and quadrature clock signals I and Q and the third serializer 113 operates in response to the input clock signal clk. At very high speeds of operation, small delays through the clock generator 102 may become significant. In these cases, a delay 124 may be inserted into the clock signal clk so that its edges arrives at the third serializer 113 at the same time that edges of the in-phase and quadrature clock signals arrive at the first and second serializers 111 and 112.

FIG. 6 also provides a sketch 130 of the in-phase, quadrature and input clock signals. The sketch shows the in-phase and quadrature clock signals to have a rate one half that of the input clock signal with the rising edges of the in-phase clock signal coincident with rising edges of the input clock signal. Because the quadrature clock signal is in quadrature with the in-phase clock signal, its rising edges are coincident with falling edges of the input clock signal.

The parallel input data streams provide parallel data bits A, B, C and D which remain constant for time periods such as the one indicated in the sketch 130. On a rising edge of the in-phase clock, the data bit A is captured at the output of the flip-flop 116 but that data is not multiplexed to the signal line 121 until the following falling edge of the in-phase clock. On a falling edge of the in-phase clock, the data bit C is captured at the output of the flip-flop 115 but that data is not multiplexed to the signal line 121 until the following rising edge of the in-phase clock as again shown in the sketch 130. The bits A and C are superimposed on the in-phase clock signal I to show the times at which they would appear at the output 121 of the first serializer.

The same capture and multiplex operations take place in the second serializer 112 which operates in response to the quadrature clock signal Q. The bits B and D are superimposed on the quadrature clock signal Q to show the times at which they would appear at the output 122 of the second serializer. For proper operation of the first and second serializers, therefore, the data in the input parallel data streams must remain constant for a rising and a falling edge of the in-phase clock and for a falling and rising edge of the quadrature clock. This time period of constant parallel data is indicated in the sketch 130.

The third serializer 113 operates with the same processes described above for the first and second serializer and the bits A, B, C and D are superimposed on the input clock signal clk in the sketch 130 to show the times at which they would appear at the output of the third serializer 113.

Because the clock generator 102 provides half-rate in-phase and quadrature clock signals to the first and second serializers 111 and 112, these serializers operate at a reduced rate compared to the third serializer 113. This permits the data serializer 100 to operate at higher rates than conventional data serializers which require substantially all of their components to operate at the output rate. Although additional attention must be applied to construction details (e.g., layout) of the third serializer 113 to insure proper operation at the highest output rate, operational requirements of the first and second serializers 111 and 112 are relatively relaxed because they operate at the reduced rate.

This relaxation applies to other serializers in data serializer embodiments that are configured to process higher numbers of parallel data streams. For example, an arrow 131 in FIG. 6 indicates that another pair of serializers (similar to the first and second serializers 111 and 112) may be provided ahead of the first serializer 111 along with a duplicate of the clock generator 102 that would process the in-phase clock signal I into half-rate in-phase and clock signals for this added pair. Similarly, an arrow 132 indicates that another pair of serializers may be provided ahead of the second serializer 112 along with a duplicate of the clock generator 102 that would process the quadrature clock signal Q into half-rate in-phase and clock signals for this added pair. This augmented data serializer would be able to process eight parallel data streams into the output data stream and the added components would operate at even lower data rates so that their operational requirements are also relaxed The embodiments of the invention described herein are exemplary and numerous modifications, variations and rearrangements can be readily envisioned to achieve substantially equivalent results, all of which are intended to be embraced within the spirit and scope of the appended claims.

We claim:

1. A clock generator, comprising:
   first and second serially-coupled I inverters;
   first and second serially-coupled Q inverters; and
   first and second serially-coupled tri-state inverters respectively coupled to drive said first Q inverter and said first I inverter wherein an output of said first I inverter is coupled to an input of said first tri-state inverter;
   said second I and Q inverters respectively providing half-rate I and Q clock signals in response to a clock signal applied to said second tri-state inverter and inversely applied to said first tri-state inverter.

2. The clock generator of claim 1, wherein each of said first and second I inverters and each of said first and second Q inverters comprises a complementary common-source transistor stage.

3. The clock generator of claim 1, wherein each of said first and second tri-state inverters comprises:
   an outer complementary common-source transistor stage; and
   an inner complementary common-source transistor stage inserted between sources of said outer complementary common-source transistor stage.

4. A data serializer, comprising:
   a clock generator configured to provide half-rate in-phase and quadrature clock signals in response to an input clock signal; and
   first, second and third serializers that each include first and second D flip-flops and a multiplexer arranged to multiplex signals from said first and second flip-flops wherein said third serializer is arranged to provide a serial data stream in response to data streams from said first and second serializers and said first, second and third serializers are respectively clocked by said in-phase, quadrature and input clock signals;
   wherein said clock generator comprises:
   first and second serially-coupled I inverters;
   first and second serially-coupled Q inverters; and
   first and second serially-coupled tri-state inverters respectively coupled to drive said first Q inverter and said first I inverter wherein an output of said first I inverter is coupled to an input of said first tri-state inverter;
   said second I and Q inverters respectively providing said input and quadrature clock signals in response to said input clock signal applied to said second tri-state inverter and inversely applied to said first tri-state inverter.

5. The serializer of claim 4, further including a signal delay inserted to delay said input clock signal prior to application to said third serializer.

6. The serializer of claim 4, wherein said input clock signal is inversely applied to a selected one of said first and second flip-flops.

7. The serializer of claim 4, wherein each of said first and second tri-state inverters comprises:
   an outer complementary common-source transistor stage; and
   an inner complementary common-source transistor stage inserted between sources of said outer complementary common-source transistor stage.

8. The serializer of claim 4, wherein each of said first and second inverters and each of said first and second Q inverters comprises a complementary common-source transistor stage.

* * * * *